United States Patent
Cheng et al.

(10) Patent No.: US 10,170,548 B2
(45) Date of Patent: Jan. 1, 2019

(54) INTEGRATED CAPACITORS WITH NANOSHEET TRANSISTORS

(71) Applicant: International Business Machines Corporation, Armonk, NY (US)

(72) Inventors: Kangguo Cheng, Schenectady, NY (US); James J. Demarest, Rensselaer, NY (US); John G. Gaudiello, Waterford, NY (US); Juntao Li, Cohoes, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/927,441

(22) Filed: Mar. 21, 2018

(65) Prior Publication Data
US 2018/0219066 A1   Aug. 2, 2018

Related U.S. Application Data

(62) Division of application No. 15/197,858, filed on Jun. 30, 2016, now Pat. No. 9,985,097.

(51) Int. Cl.
*H01L 29/06* (2006.01)
*H01L 29/161* (2006.01)
(Continued)

(52) U.S. Cl.
CPC ......... *H01L 29/0665* (2013.01); *B82Y 10/00* (2013.01); *H01L 21/02175* (2013.01); *H01L 21/02532* (2013.01); *H01L 21/31111* (2013.01); *H01L 21/823412* (2013.01); *H01L 21/823481* (2013.01); *H01L 27/0629* (2013.01); *H01L 28/88* (2013.01); *H01L 28/91* (2013.01); *H01L 29/161* (2013.01); *H01L 29/42392* (2013.01);
(Continued)

(58) Field of Classification Search
CPC .......... H01L 29/0665; H01L 21/02175; H01L 21/0253; H01L 21/31111; H01L 21/823412; H01L 21/823481; H01L 27/0629; H01L 28/88; H01L 28/91; H01L 29/161; H01L 29/4239; H01L 29/66545; H01L 29/0673; H01L 29/775; H01L 21/02532
USPC .................................................. 257/306, 438
See application file for complete search history.

(56) References Cited

U.S. PATENT DOCUMENTS

2016/0020305 A1* 1/2016 Obradovic .......... H01L 29/7391
257/39
2018/0006113 A1   1/2018 Cheng et al.

OTHER PUBLICATIONS

List of IBM Patents or Patent Applications Treated As Related; (Appendix P), Date Filed Mar. 21, 2018; 2 pages.

* cited by examiner

*Primary Examiner* — Hrayr A Sayadian
(74) *Attorney, Agent, or Firm* — Cantor Colburn LLP; Vazken Alexanian

(57) ABSTRACT

A semiconductor device and process of making the same generally includes simultaneously forming nanosheet capacitors with nanosheet FET devices on the same substrate. The nanosheets in the capacitor have a width and are coupled to one another by sacrificial layers, wherein the sacrificial layers have a width smaller than the nanosheet width, and wherein the nanosheets and the sacrificial layers are conductively coupled to the substrate. The nanosheets in the FET devices are spaced apart and free of sacrificial
(Continued)

layers. The nanosheets in the FET device have a width less than half the width of the nanosheets in the capacitor region.

20 Claims, 20 Drawing Sheets

(51) Int. Cl.
*H01L 27/06* (2006.01)
*H01L 21/8234* (2006.01)
*H01L 21/311* (2006.01)
*H01L 21/02* (2006.01)
*H01L 29/66* (2006.01)
*B82Y 10/00* (2011.01)
*H01L 29/423* (2006.01)
*H01L 49/02* (2006.01)
*H01L 29/775* (2006.01)

(52) U.S. Cl.
CPC .... *H01L 29/66545* (2013.01); *H01L 29/0673* (2013.01); *H01L 29/775* (2013.01)

INTEGRATED CAPACITORS WITH NANOSHEET TRANSISTORS

DOMESTIC PRIORITY

This Application is a DIVISIONAL of U.S. patent application Ser. No. 15/197,858, filed Jun. 30, 2016, the contents of which are fully incorporated by reference herein in its entirety.

BACKGROUND

The present invention generally relates to semiconductor integrated circuits, and more particularly, to a method and structure for simultaneously forming integrated capacitors with nanosheet channel field effect transistors.

CMOS is used for constructing integrated circuits. CMOS technology is used in microprocessors, microcontrollers, static RAM, and other digital logic circuits. CMOS designs may use complementary and symmetrical pairs of p-type and n-type metal oxide semiconductor field effect transistors (MOSFETs) for logic functions.

The MOSFET is a transistor used for switching electronic signals. The MOSFET has a source, a drain, and a metal oxide gate electrode. The metal gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

Decoupling capacitors are a type of capacitor used to decouple one part of an electrical network (circuit) from another. Noise caused by other circuit elements is shunted through the capacitor, reducing the effect it has on the rest of the circuit. An alternative name is bypass capacitor as it is used to bypass the power supply or other high impedance component of a circuit.

As integrated circuits continue to scale down and become more densely built, nanosheet field effect transistors (FETs) are an attractive alternative to Fin FETs or planar devices for future CMOS nodes.

SUMMARY

The present invention is generally directed to semiconductor devices and methods of forming the semiconductor devices.

In one or more embodiments, the semiconductor device includes a capacitor region and a FET region defined by a plurality of stackedly and alternatingly arranged nanosheets and sacrificial layers disposed on a substrate, wherein the nanosheets in the capacitor region have a width and are coupled to one another by the sacrificial layers, wherein the sacrificial layers have a width smaller than the nanosheet width; wherein the nanosheets in the FET region are spaced apart and free of sacrificial layers, the nanosheets in the FET region having a width less than half the width of the nanosheets in the capacitor region.

In one or more embodiments, the method of forming the semiconductor device includes depositing alternating nanosheet layers and sacrificial layers onto a substrate; simultaneously forming fins in a capacitor region and fins in a device region, wherein the fins in the capacitor region have a greater width than the fins in the device region; selectively etching the sacrificial layers to form an undercut in the capacitor region and complete removal in the device region; doping the alternating nanosheet layers and undercut sacrificial layers in the capacitor region, and portions of the substrate underlying the capacitor region; depositing a high k dielectric layer onto the alternating nanosheet layers and undercut sacrificial layers in the capacitor region, and portions of the substrate underlying the capacitor region, and on the nanosheet layers in the device region; and forming top and bottom electrodes in the capacitor region.

In one or more embodiments, the method of forming the semiconductor device includes depositing a film stack onto a silicon substrate, the film stack comprising alternating layers of silicon and silicon-germanium; simultaneously defining a capacitor region by forming fins in the film stack having a first width and a device region by forming fins in the film stack having a second width; isotropically etching the silicon-germanium to form an undercut in the capacitor region and complete removal in the device region, wherein the second width of the film stack in the device region is at least less than half of the first width of the film stack in the capacitor region such that isotropic etching forms the undercut in the capacitor region and complete removal in the device region; doping the nanosheet, sacrificial layers, and portions of the substrate underlying the capacitor region; depositing a high k dielectric layer onto the nanosheet, sacrificial layers, and portions of the substrate underlying the capacitor region, and on the nanosheet layers in the device region; and forming top and bottom electrodes in the capacitor region.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. ("FIG.") 1 depicts a schematic cross-sectional view illustrating stackedly arranged nanosheets and sacrificial layers disposed on a substrate for simultaneous formation of a nanosheet field effect transistor and a capacitor in accordance with the present disclosure.

Figure 1:
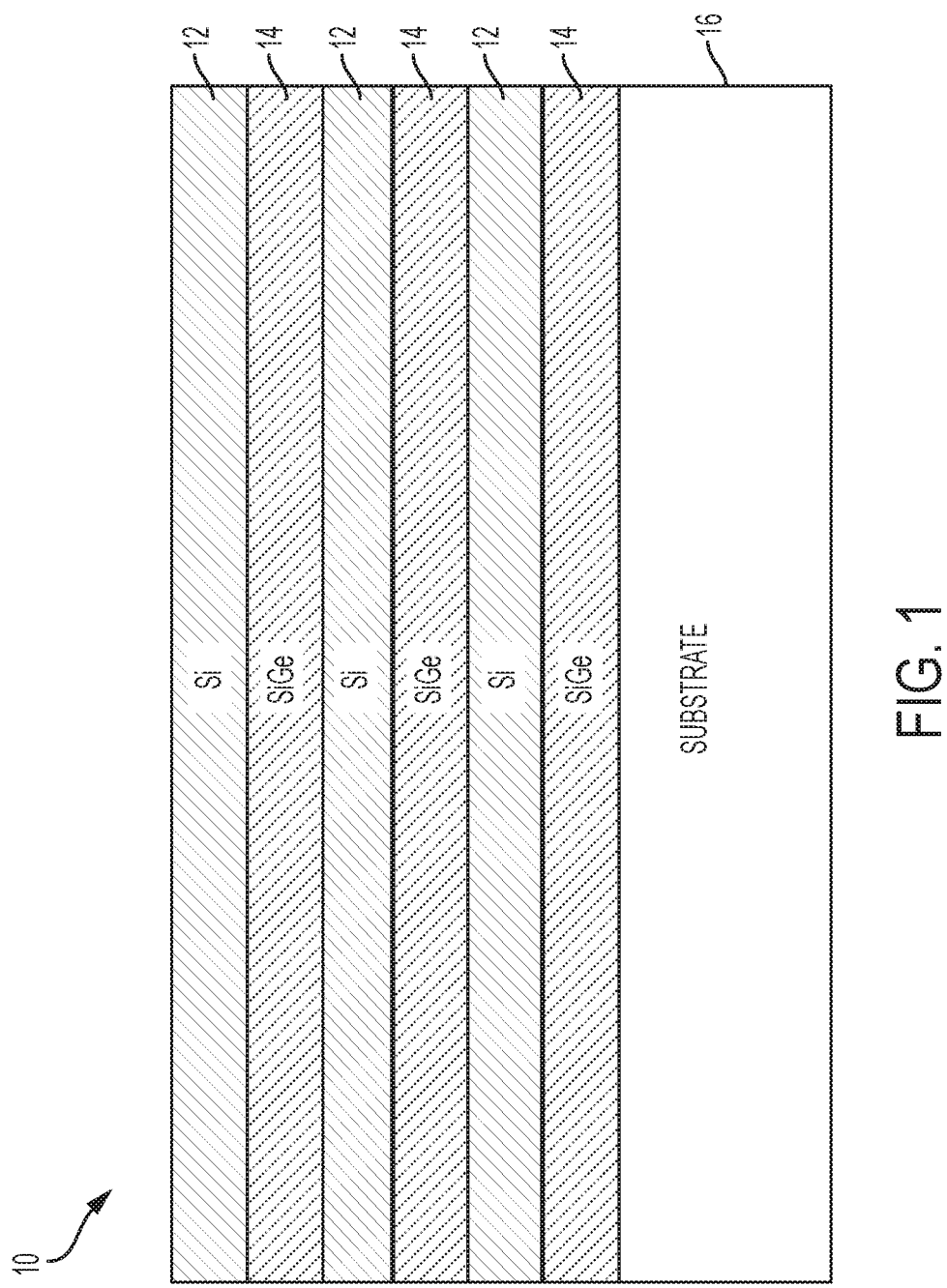

The detailed description explains the preferred embodiments of the invention, together with advantages and features, by way of example with reference to the drawings.

DETAILED DESCRIPTION

The present invention generally relates to a method and structure for simultaneously forming integrated capacitors with nanosheet channel field effect transistors.

FIGS. 1-38 are cross-sectional and top down views illustrating methods and structures for fabricating nanosheet capacitors and nanosheet channel field effect transistors (FETs) in accordance with one or more embodiments of the present disclosure. As will be discussed in greater detail below, the nanosheet capacitors and nanosheet channel field effect transistors (FETs) are simultaneously formed from the same stack of nanosheets and sacrificial layers to define capacitor regions and device regions. The stacked nanosheet FETs have been developed to further enable larger effective conduction width in a small layout area overlying a substrate. The stacked nanosheet FETs generally include multiple nanosheets arranged in a three dimensional array on a substrate with a gate stack formed on a channel region of the nanosheets. The gate stack may surround four sides of the channel region of a nanosheet (gate-all-around). The nanosheet capacitor is fabricated simultaneously with the nanosheet FET.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" another element, there are no intervening elements present, and the element is in contact with another element.

Turning now to FIG. 1, there is shown a plurality of nanosheets and sacrificial layers 12, 14 respectively, of a semiconductor material, such as silicon, silicon-germanium, indium-gallium-arsenide, or the like, alternatingly formed on a substrate 16 using well-known techniques. Non-limiting examples of substrate 16 materials include Si (silicon), strained Si, SiC (silicon carbide), Ge (germanium), SiGe (silicon germanium), SiGeC (silicon-germanium-carbon), Si alloys, Ge alloys, GaAs (gallium arsenide), InAs (indium arsenide), InP (indium phosphide), or any combination thereof. Other examples of suitable substrates include silicon-on-insulator (SOI) and silicon-germanium-on-insulator (SGOI) substrates with buried oxide (BOX) layers.

Each nanosheet layer 12 comprises a thickness and a width, and is separated from another nanosheet layer 12 by the sacrificial layer 14 comprising the same or different thickness and the same width. In an exemplary embodiment, the thickness of the nanosheet and sacrificial layers 12, 14, respectively, ranges from about 3 nm to about 30 nm, about 5 to about 20 nm in other embodiments, and about 10 nm in still other embodiments.

In one or more embodiments, the nanosheet layer 12 and substrate 16 comprise silicon and the sacrificial layer is silicon-germanium. Alternatively, the nanosheet layers and the substrate can comprise silicon-germanium and the sacrificial layer can comprise silicon. In an exemplary nanosheet capacitor structure, the active nanosheet 12 is a silicon layer and the sacrificial layer 14 is a silicon-germanium layer.

The nanosheets and sacrificial layers 12, 14, respectively, may be formed on the substrate 16 by for example, chemical vapor deposition (CVD) (liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes.

Figure 2:
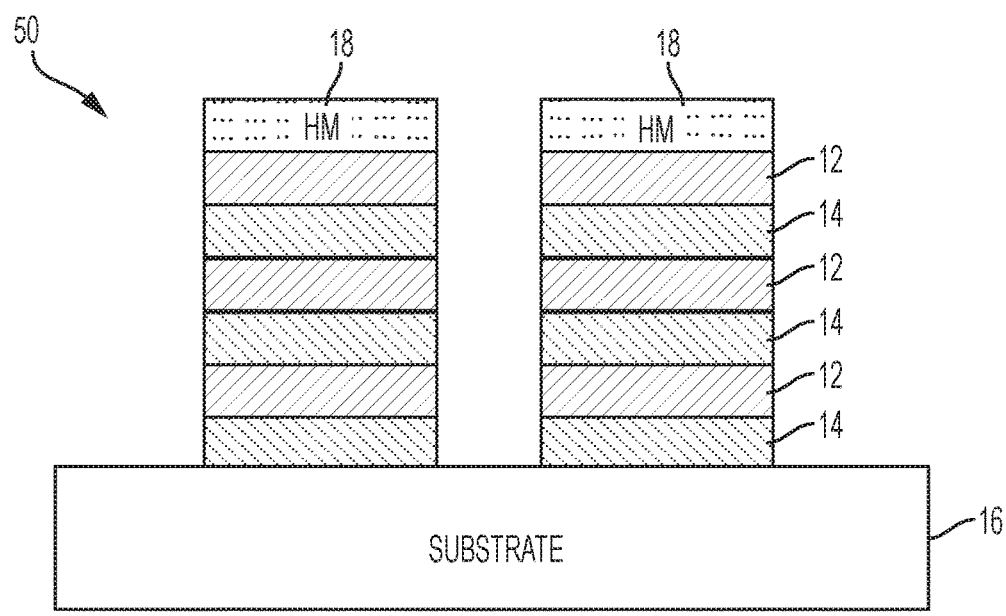
FIG. 2 depicts a schematic cross-sectional view of a nanosheet capacitor region taken along lines 2-2 of FIG. 3 following fin formation after a sidewall image transfer patterning process.
Figure 3:
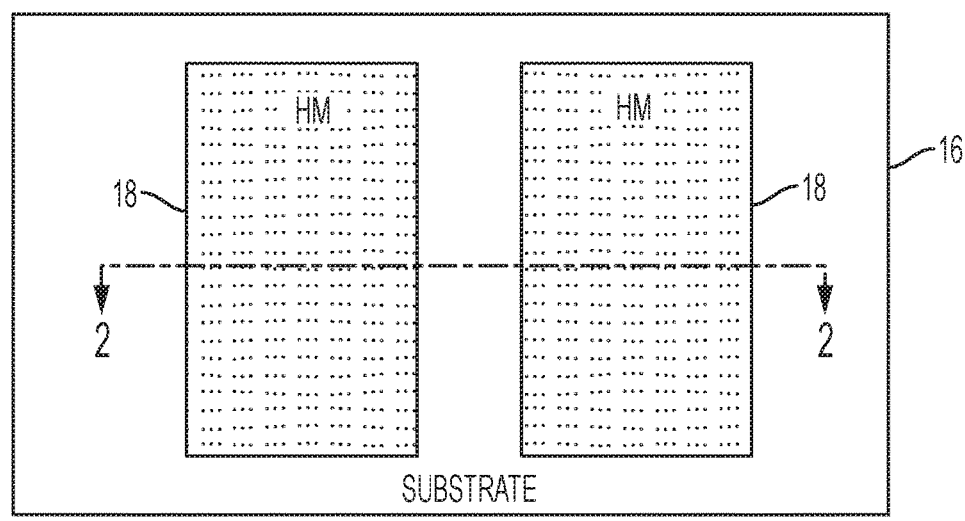
FIG. 3 depicts a top down view of the nanosheet capacitor region of FIG. 2 following fin formation after the sidewall image transfer patterning.
Figure 4:
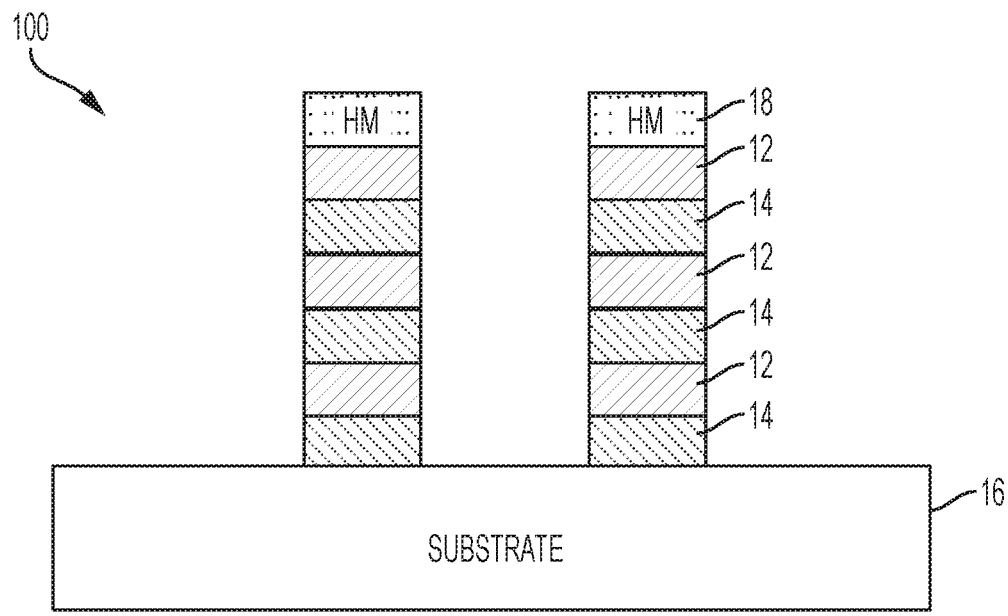
FIG. 4 depicts a schematic cross-sectional view of the nanosheet device region taken along lines 4-4 of FIG. 5 following fin formation after a sidewall image transfer patterning process.
Figure 5:
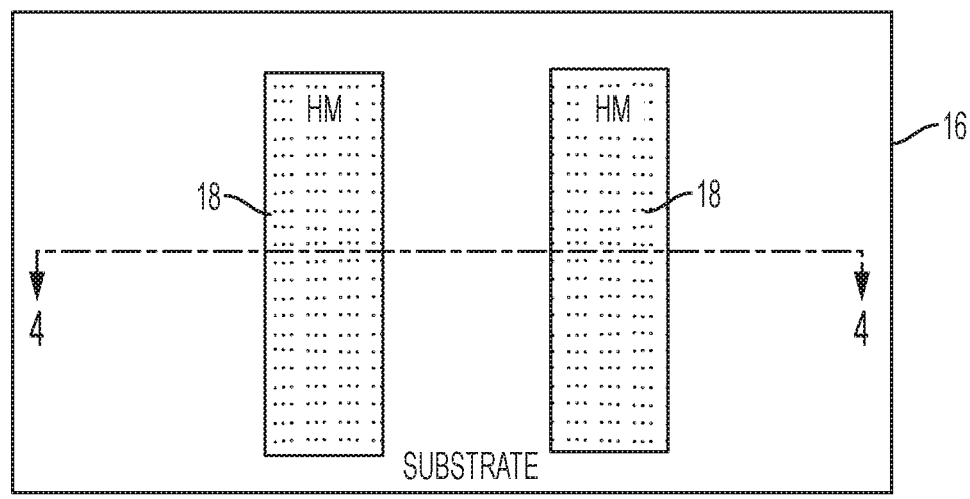
FIG. 5 depicts a top down view of the nanosheet device region of FIG. 4 following fin formation after the sidewall image transfer patterning.

Referring now to FIG. 2-3, the capacitor fins for the nanosheet capacitor region 50 are formed whereas in FIGS. 4-5, the fins for the nanosheet device region 100 are formed. Both fins can be formed on the substrate by a sidewall image transfer (SIT) process using hard mask 18. SIT generally involves the usage of a sacrificial structure (e.g., a mandrel, typically composed of a polycrystalline silicon). A sidewall spacer (such as silicon dioxide or silicon nitride, $Si_3N_4$, for example) having a thickness less than that permitted by the current ground rules is formed on the sides of the mandrel (e.g., via oxidization or film deposition and etching). After removal of the mandrel, the remaining sidewall spacer is used as a hard mask to etch the nanosheet layers below, for example, with a directional RIE. Because the sidewall has a (sublithographic) width less than the ground rules, the structure formed in the layer below will also have a sublithographic width.

The width of the capacitor fin ranges from about 25 to 75 nm in most embodiments, and about 50 nm in other embodiments. In contrast, the fin width in the nanodevice region is markedly smaller by more than half the fin width of the capacitor region. By way of example, the widths of the fins in the capacitor region can made to be about 50 nm and the widths of the fins in the nanodevice region can be about 20 nm using the SIT process.

One exemplary additive SIT process is as follows. A mandrel (e.g., a narrow band) is defined across a hard mask on a substrate. Specifically, a multi-layer stack comprising, for example, a substrate with underlying polysilicon for FET gate patterning, a thin dielectric (e.g., nitride) hard mask layer, a thick mandrel (e.g., a polysilicon) layer, and a mandrel mask layer, is patterned and etched using standard lithographic techniques to form the mandrel with vertical walls above the hard mask layer. Then, spacers are formed on the hard mask adjacent to the walls of the mandrels (e.g., by depositing a thin conformal oxide or nitride layer and performing an anisotropic etch to remove the conformal oxide or nitride layer from the top of the mandrel layer and from horizontal surfaces). The spacer thickness is chosen to be the same as that of the desired width of the final shape (factoring in any etch film erosion). Thus, spacers are formed on the vertical walls of a mandrel and these spacers determine the final pattern widths and tolerances of the components being formed in the substrate.

Figure 6:
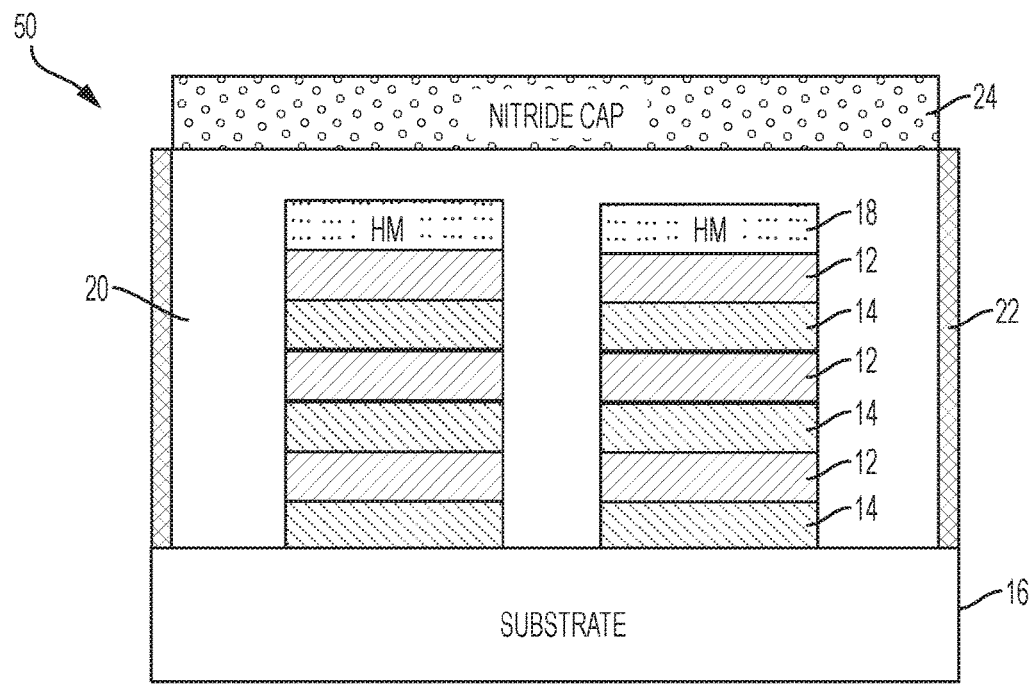
FIG. 6 depicts a schematic cross-sectional view of the nanosheet capacitor region taken along lines 6-6 of FIG. 7 following dummy gate patterning and sidewall spacer formation.
Figure 7:
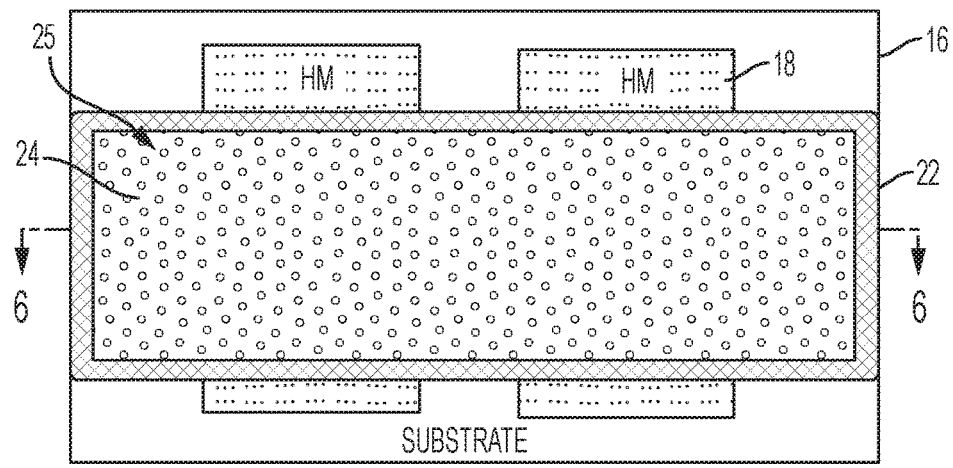
FIG. 7 depicts a top down view of the nanosheet capacitor region of FIG. 6 following dummy gate patterning and sidewall spacer formation.
Figure 8:
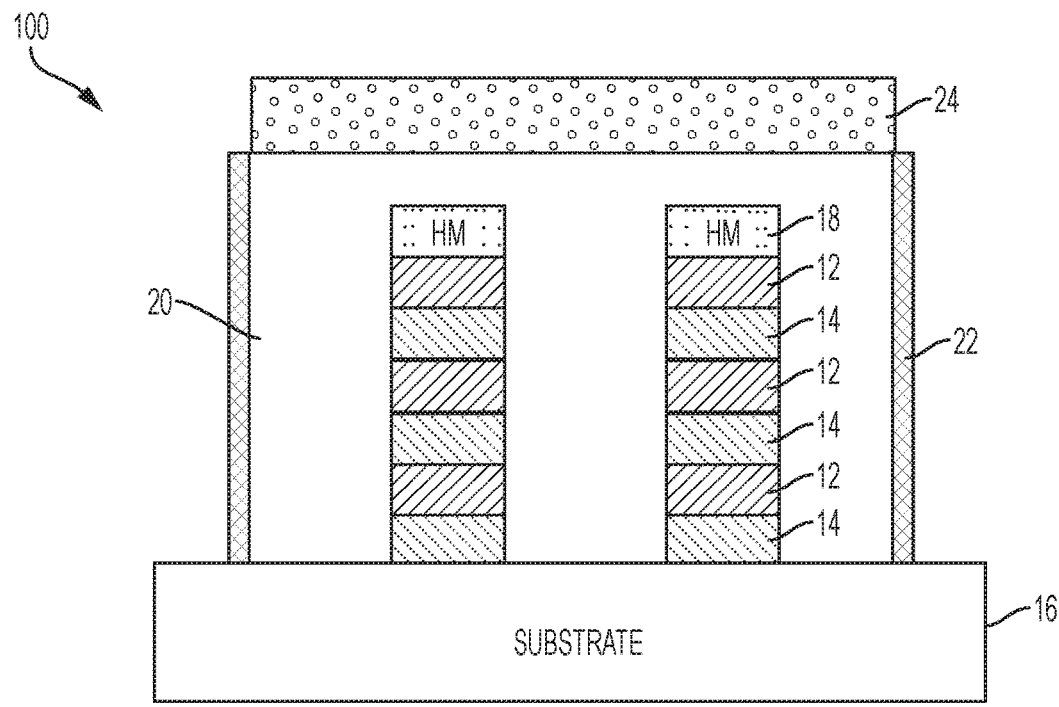
FIG. 8 depicts a schematic cross-sectional view of the nanosheet device region taken along lines 8-8 of FIG. 9 following dummy gate patterning and sidewall spacer formation in the nanosheet device region.
Figure 9:
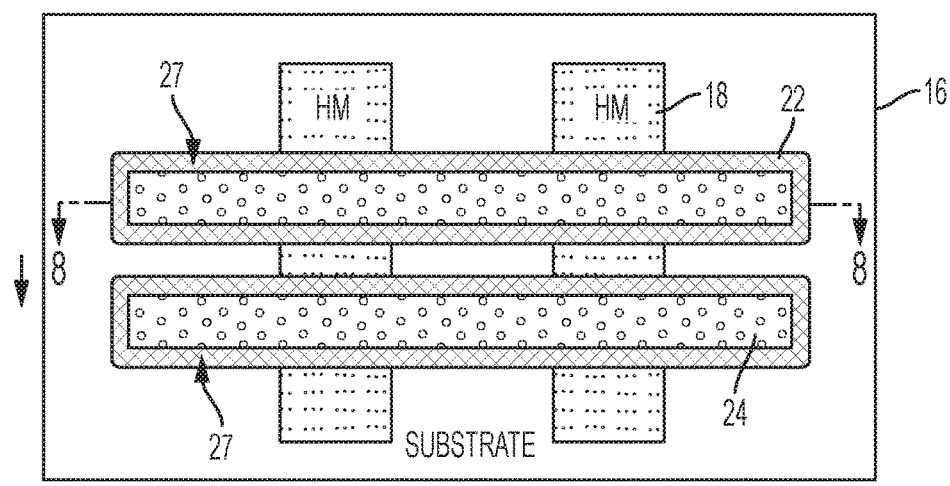
FIG. 9 depicts a top down view of the nanosheet device region of FIG. 8 following dummy gate patterning and sidewall spacer formation.
Figure 10:
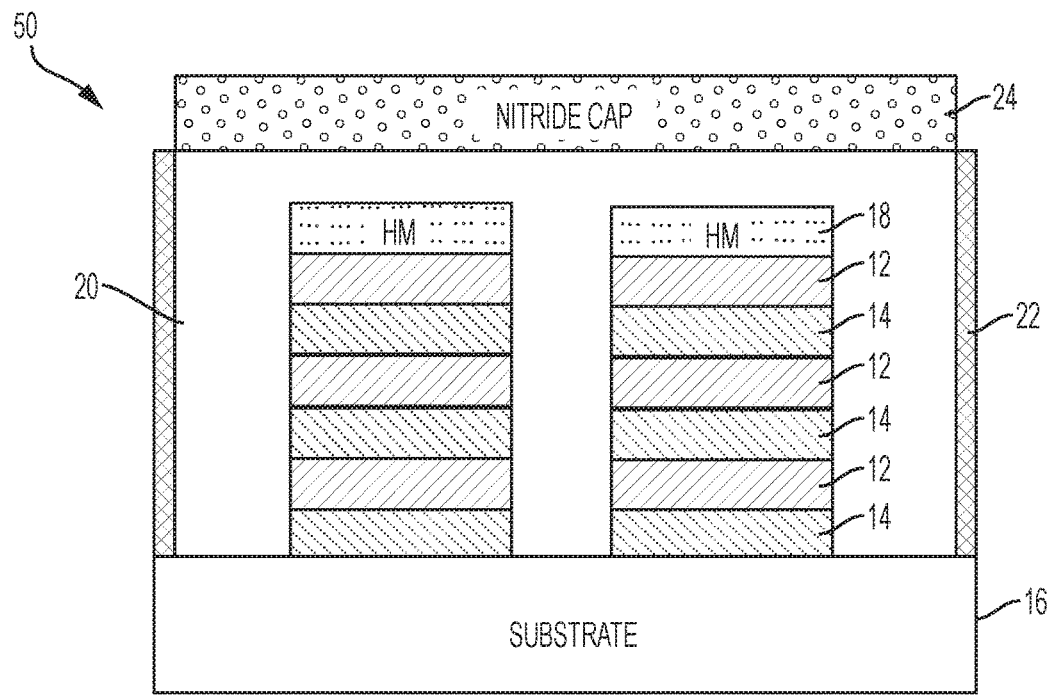
FIG. 10 depicts a schematic cross-sectional view of the nanosheet capacitor region taken along lines 10-10 of FIG. 11 following hardmask removal outside of dummy gate and epitaxial SiGe growth.

In the capacitor region 50 as shown in FIGS. 6-7 as well as in the nanosheet region 100 shown in FIGS. 8-9, a dummy gate structure 25, 27, respectively, with sidewall spacers is formed. A blanket sacrificial gate material 20, for example, amorphous silicon (aSi) or polycrystalline silicon (polysilicon), is deposited on the first and second nanosheet stacks and patterned as shown. The sacrificial gate material 20 may be deposited by a deposition process, including, but not limited to, physical vapor deposition (PVD), chemical vapor deposition (CVD), plasma enhanced chemical vapor deposition (PECVD), inductively coupled plasma chemical vapor deposition (ICP CVD), or any combination thereof.

The sidewall spacers 22 are then formed as shown. The sidewall spacers may be an insulating dielectric material, for example, silicon dioxide, silicon nitride, SiOCN, or SiBCN. Other non-limiting examples of materials for the spacer include dielectric oxides (e.g., silicon oxide, hafnium oxide, or aluminum oxide), dielectric nitrides (e.g., silicon nitride), dielectric oxynitrides, or any combination thereof. The spacer material is deposited by a deposition process, for example, chemical vapor deposition (CVD) or physical vapor deposition (PVD).

Hard mask layer 24 is then deposited on the blanket sacrificial gate material. The hard mask layer 24 may include an insulating material, for example, silicon nitride (SiN), SiOCN, or SiBCN. The hard mask layer 24 may be deposited using a deposition process, including, but not limited to, PVD, CVD, PECVD, or any combination thereof.

Figure 11:
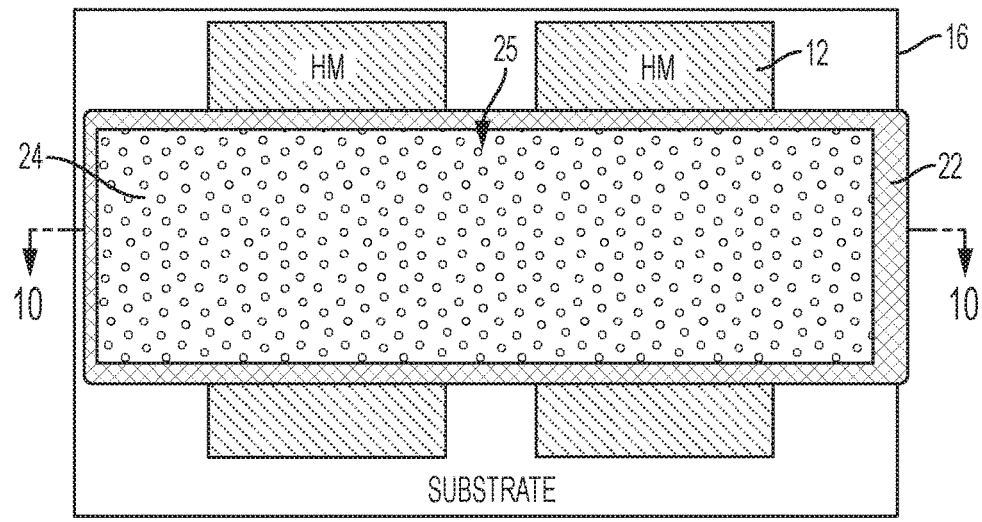
FIG. 11 depicts a top down view of the nanosheet capacitor region of FIG. 10 following dummy gate patterning and sidewall spacer formation.
Figure 12:
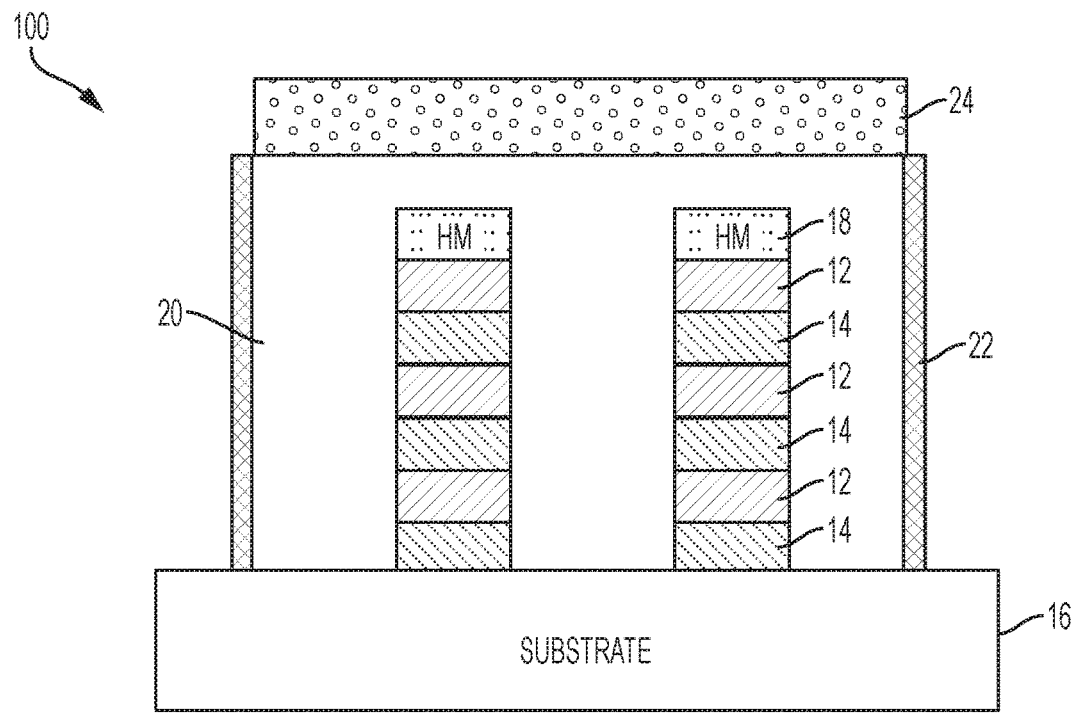
FIG. 12 depicts a schematic cross-sectional view of the nanosheet device region taken along lines 12-12 of FIG. 11 following hardmask removal outside of dummy gate and epitaxial SiGe growth.
Figure 13:
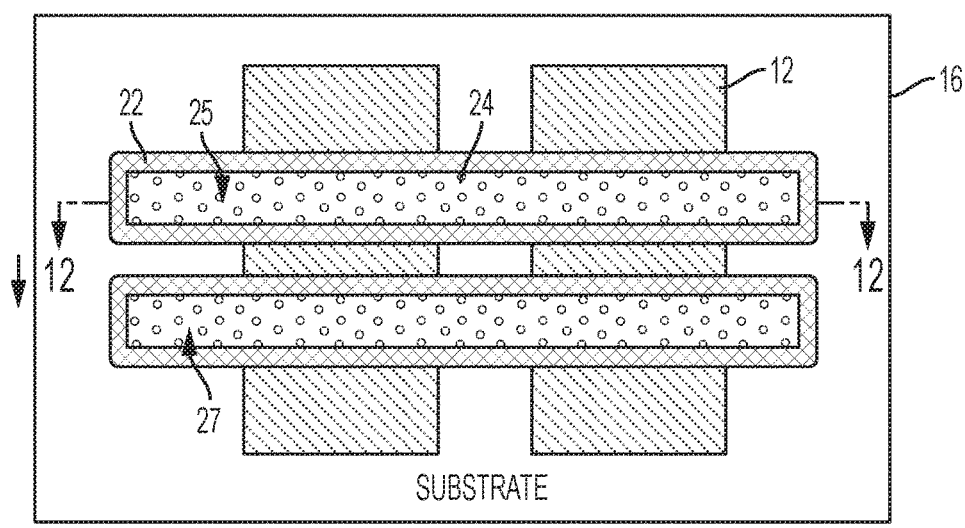
FIG. 13 depicts a top down view of the nanosheet device region of FIG. 12 following hardmask removal outside of dummy gate and epitaxial SiGe growth.
Figure 14:
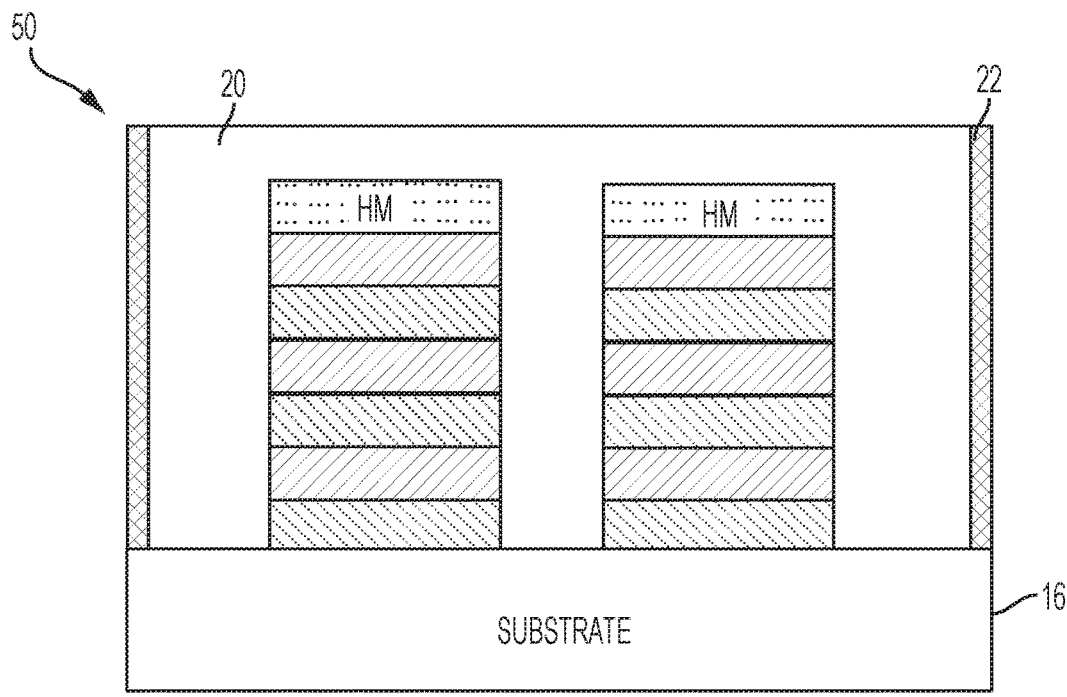
FIG. 14 depicts a schematic cross-sectional view of the nanosheet capacitor region taken along lines 14-14 of FIG. 15 following deposition of interlayer dielectric and planarization.
Figure 15:
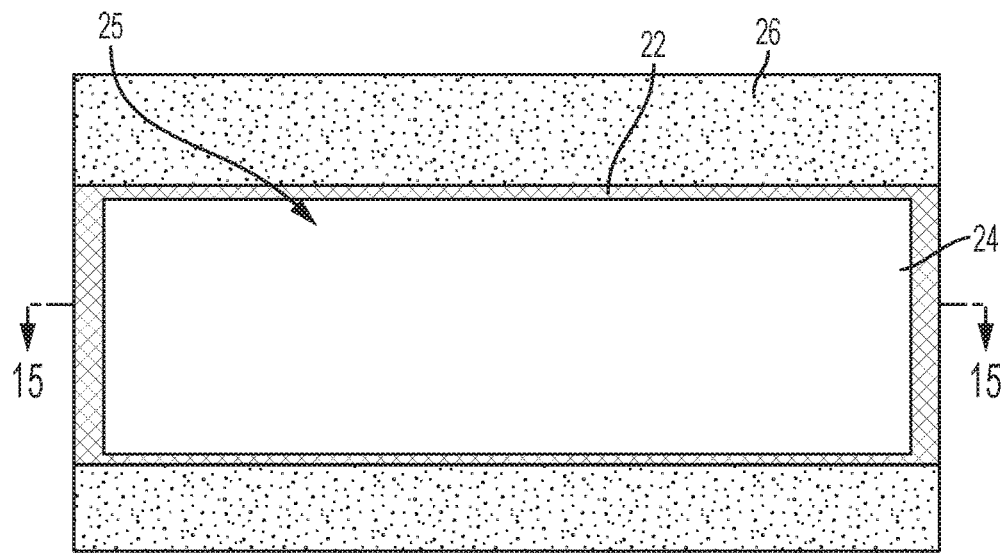
FIG. 15 depicts a top down view of the nanosheet capacitor region of FIG. 14 following deposition of interlayer dielectric and planarization.
Figure 16:
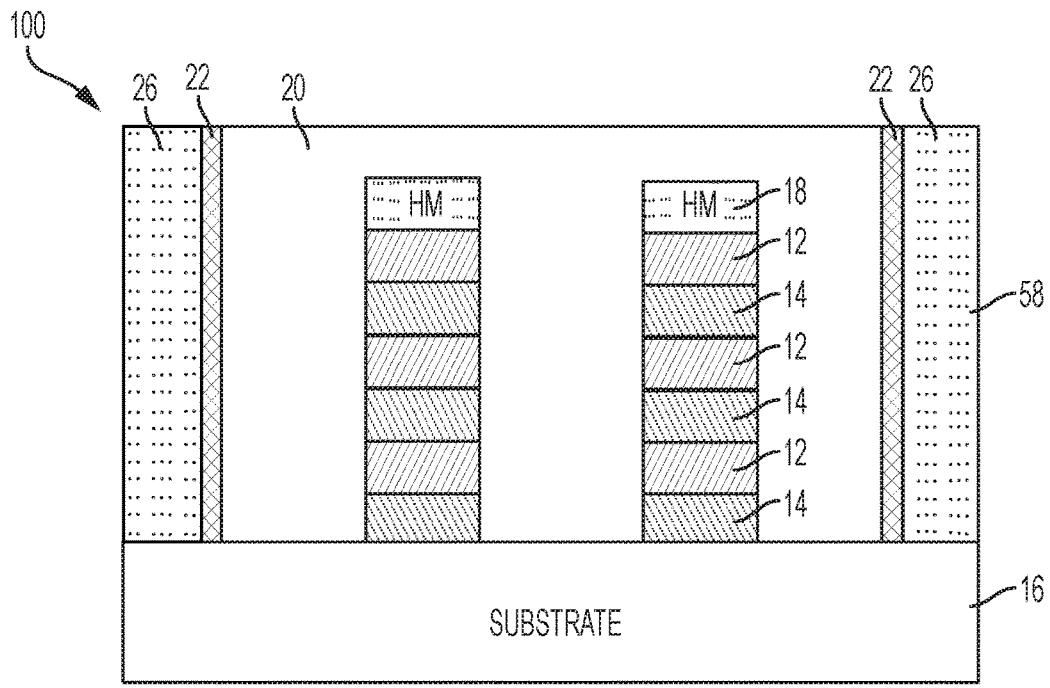
FIG. 16 depicts a schematic cross-sectional view of the nanosheet device region taken along lines 16-16 of FIG. 17 following deposition of interlayer dielectric and planarization.
Figure 17:
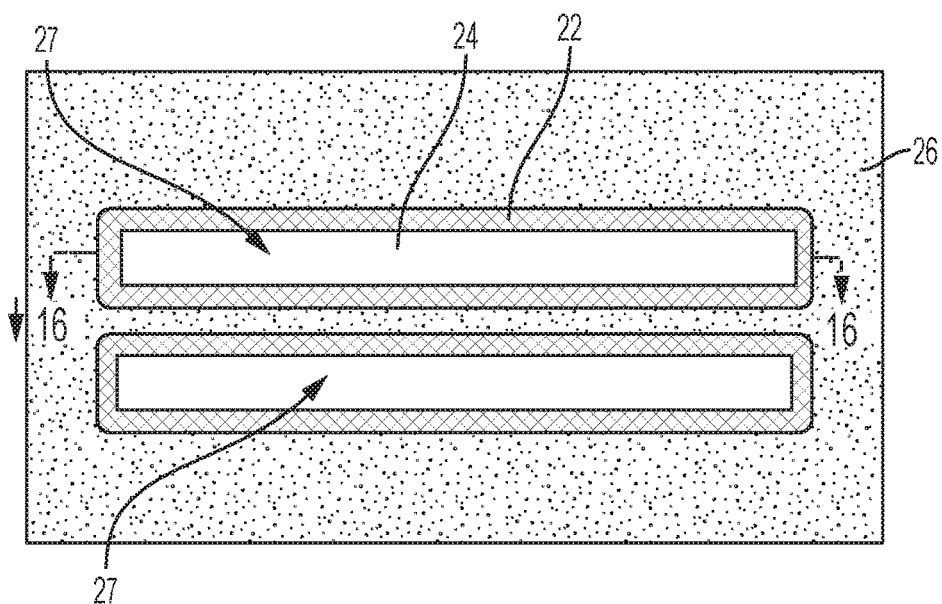
FIG. 17 depicts a top down view of the nanosheet device region of FIG. 16 following deposition of interlayer dielectric and planarization.

As shown in FIGS. 10-13, hardmask 18 in contact with the fins is removed from the portion of the fins lying outside the respective dummy gate structure 25, 27. With regard to the capacitor region 50, the top down view of FIG. 11 shows the hardmask 18 removed from the top surface of the fin, thereby exposing nanosheet 12. In the regions covered by the dummy gate structure 25, the hard mask 18 remains intact as shown in the cross sectional view of FIG. 10 taken along lines 10-10 of FIG. 11. Similarly, in the nanodevice region 100, the top down view of FIG. 13 shows the hardmask 18 removed from the top surface of the fin, thereby exposing underlying nanosheet 12. In the regions covered by the dummy gate structures 27, the hard mask 18 remains intact as shown in the cross sectional view of FIG. 12 taken along lines 12-12 of FIG. 13.

Referring now to FIGS. 14-17, an interlayer dielectric (ILD) 26 is deposited followed by planarization such as by, for example, chemical mechanical planarization (CMP), and removal of the hardmask 24. The ILD may include any materials known in the art, such as, for example, porous silicates, carbon doped oxides, silicon dioxides, silicon nitrides, silicon oxynitrides, or other dielectric materials. The ILD may be formed using any method known in the art, such as, for example, chemical vapor deposition, plasma enhanced chemical vapor deposition, atomic layer deposition, or physical vapor deposition.

Figure 18:
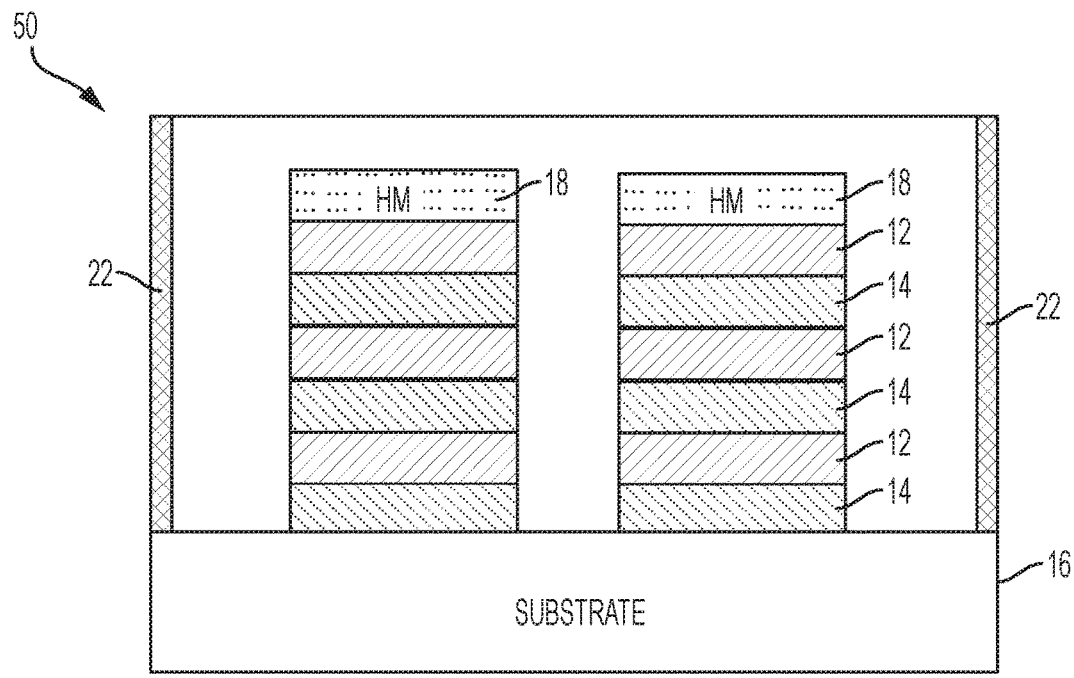
FIG. 18 depicts a schematic cross-sectional view of the nanosheet capacitor region taken along lines 18-18 of FIG. 19 following removal of dummy gate and the hardmask overlying fin top.
Figure 19:
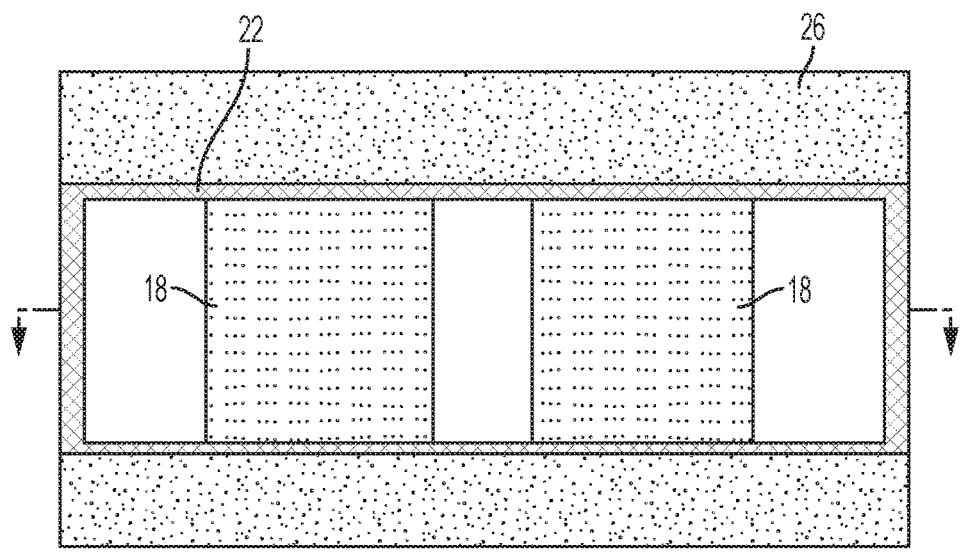
FIG. 19 depicts a top down view of the nanosheet capacitor region of FIG. 18 following removal of dummy gate and the hardmask overlying fin top.
Figure 20:
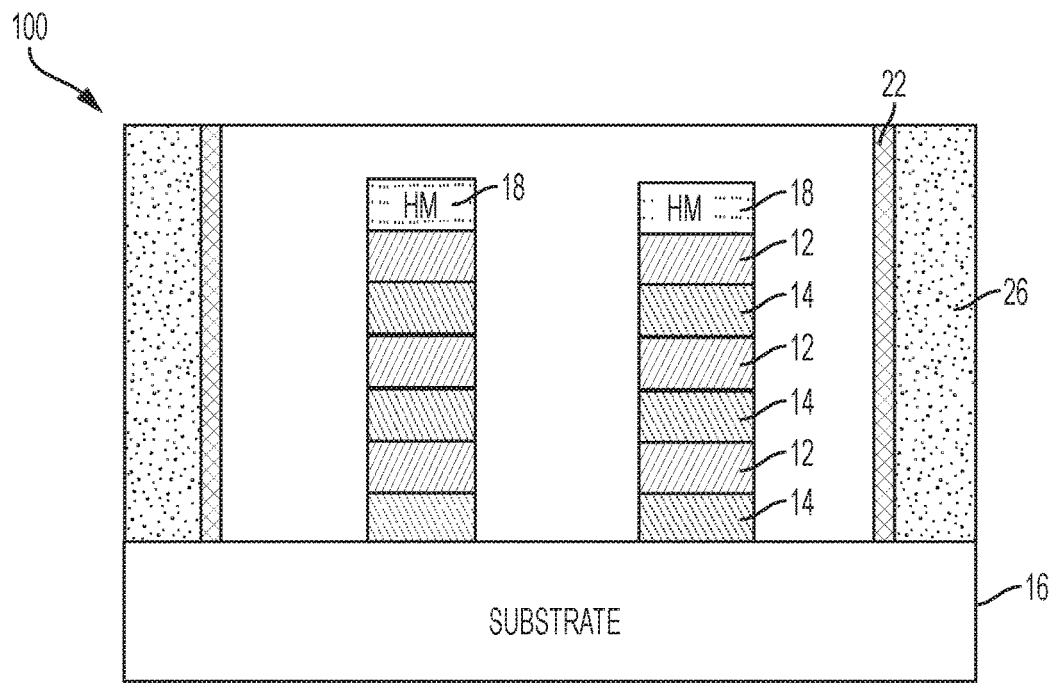
FIG. 20 depicts a schematic cross-sectional view of the nanosheet device region taken along lines 20-20 of FIG. 21 following removal of dummy gate and the hardmask overlying fin top.
Figure 21:
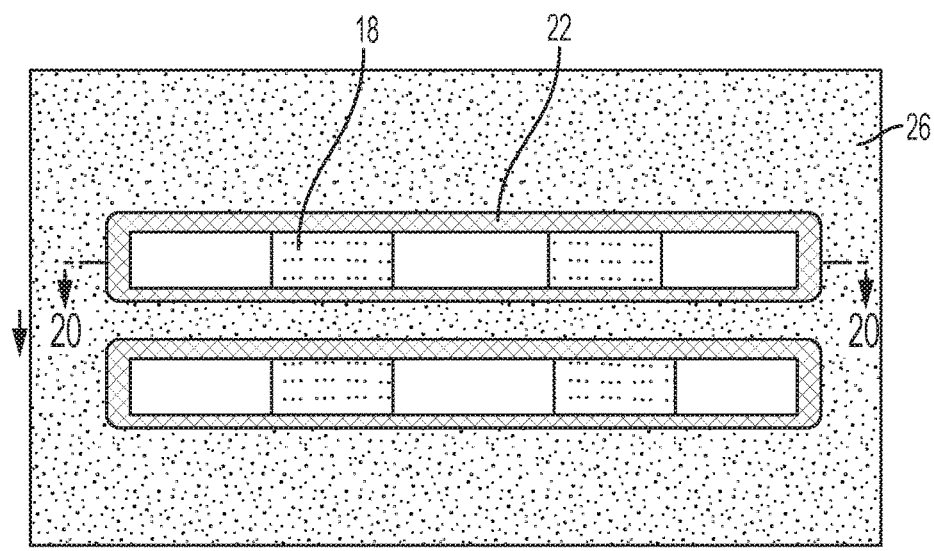
FIG. 21 depicts a top down view of the nanosheet device region of FIG. 20 following removal of dummy gate and the hardmask overlying fin top.
Figure 22:
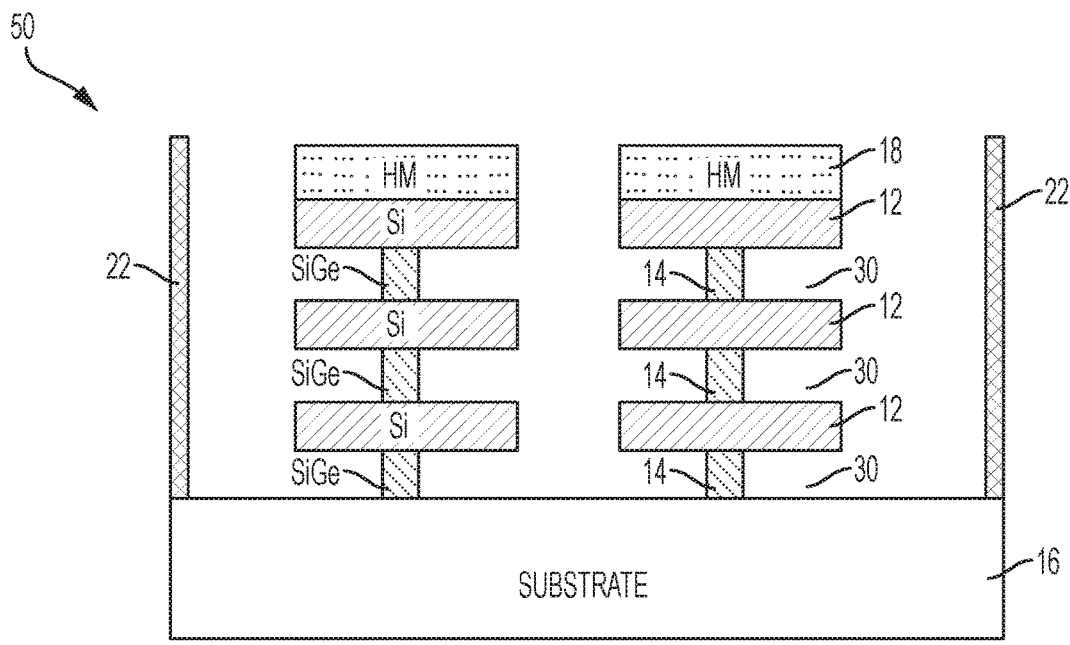
FIG. 22 depicts a schematic cross-sectional view of the nanosheet capacitor region taken along lines 22-22 of FIG. 23 following selective etching to form an undercut.
Figure 23:
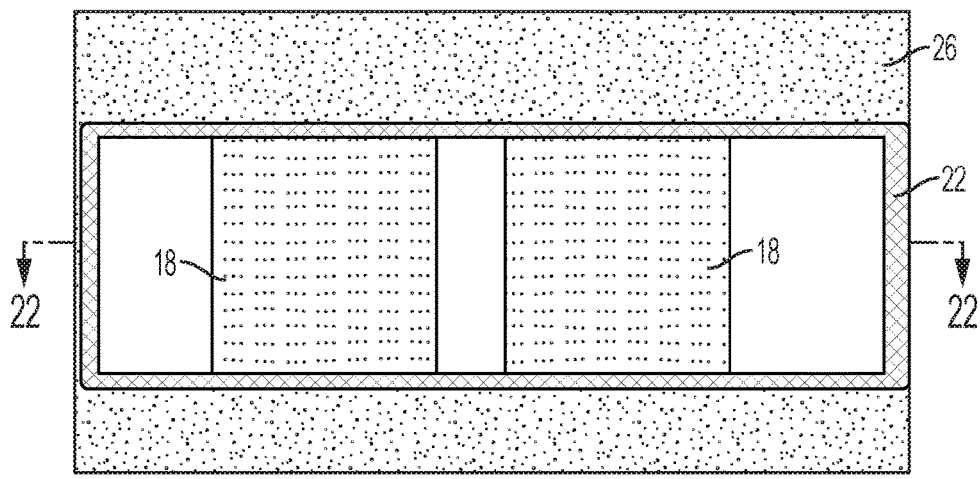
FIG. 23 depicts a top down view of the nanosheet capacitor region of FIG. 22 following selective etching to form an undercut.

Referring now to FIGS. 18-21, the dummy gate structures (25, 27) are then selectively removed from the capacitor region 50 and the nanosheet device region 100. The sidewall spacers remain. FIG. 18 is a cross sectional view of the capacitor region taken along lines 18-18 of FIG. 19, which shows the exposed capacitor fin stacks. FIG. 20 is a cross sectional view of the nanosheet device region taken along lines 20-20 of FIG. 21, which shows the exposed nanosheet device fin stacks.

Referring now to FIGS. 22-25, the sacrificial layers 14 within the respective fin stacks are isotropically etched (i.e., selective to silicon 12) using well known techniques. In the cross sectional view of FIG. 22 taken along lines 22-22 in the top down view of FIG. 23, the isotropic etch forms an undercut region 30 in the capacitor region 50.

Figure 24:
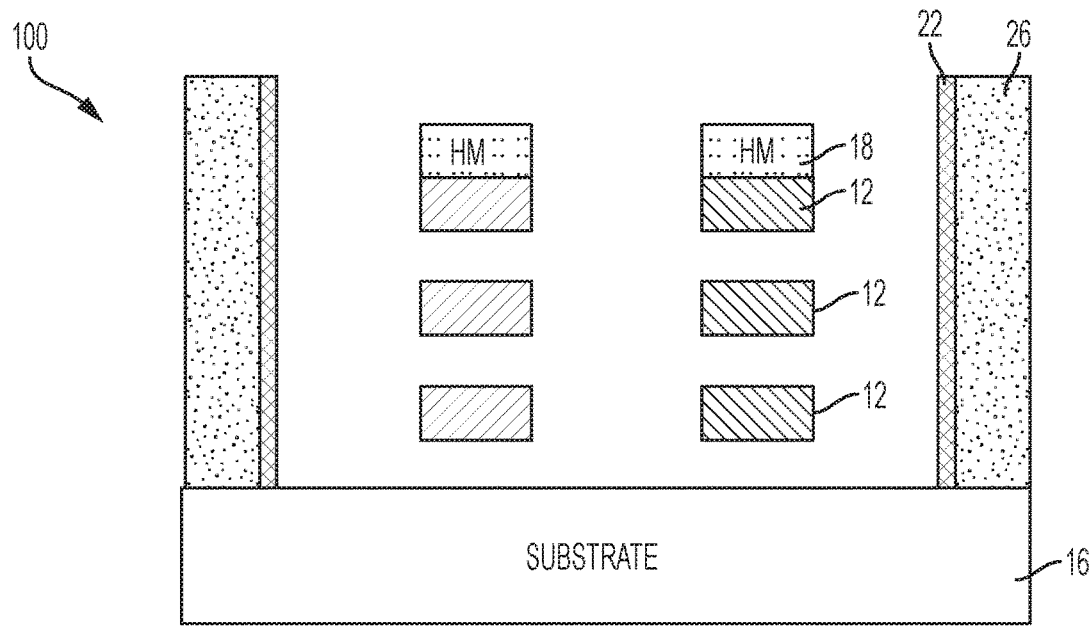
FIG. 24 depicts a schematic cross-sectional view of the nanosheet device region taken along lines 24-24 of FIG. 25 following selective etching to remove the sacrificial layer.
Figure 25:
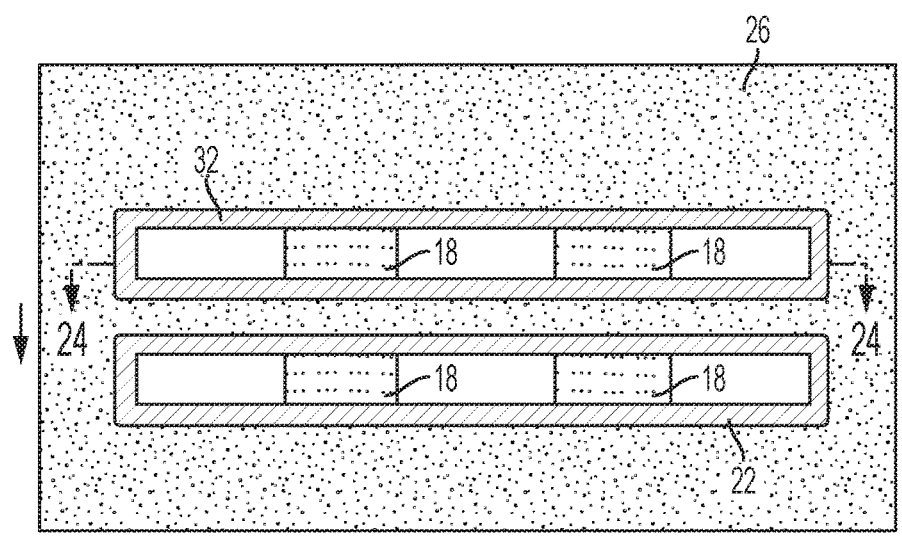
FIG. 25 depicts a top down view of the nanosheet device region of FIG. 24 following selective etching to remove the sacrificial layer.
Figure 26:
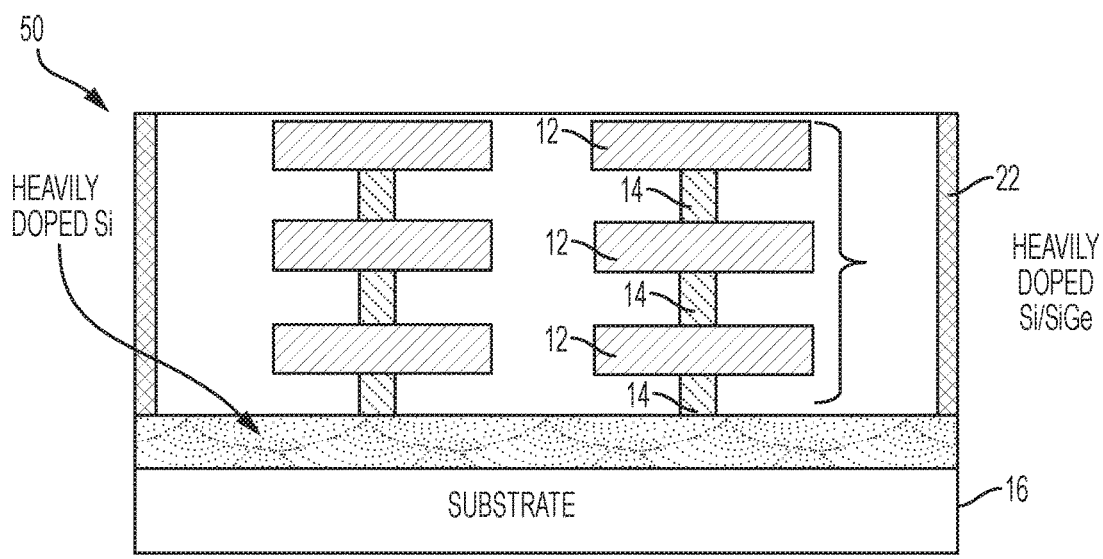
FIG. 26 depicts a schematic cross-sectional view of the nanosheet capacitor region taken along lines 26-26 of FIG. 27 following removal of hardmask overlying fin structure.
Figure 27:
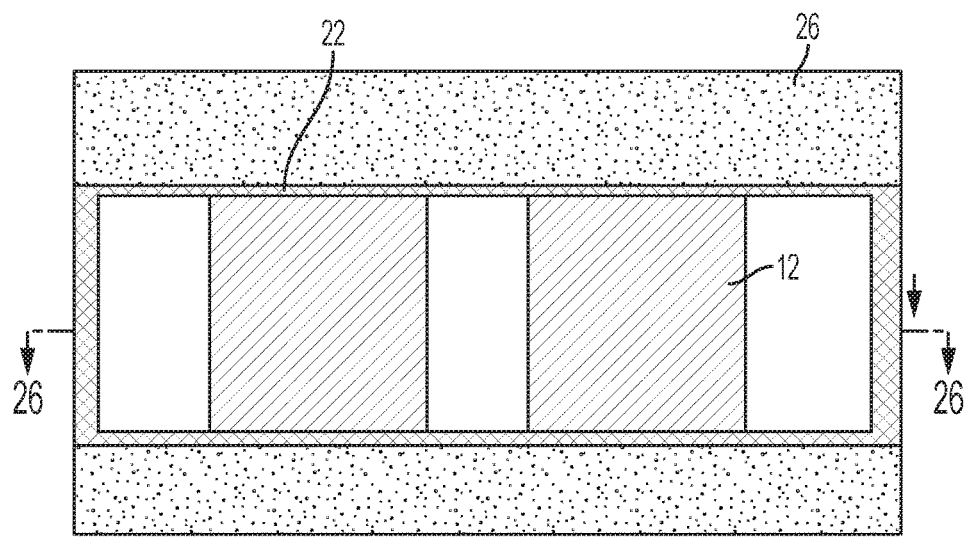
FIG. 27 depicts a top down view of the nanosheet capacitor region of FIG. 26 following removal of hardmask overlying fin structure.
Figure 28:
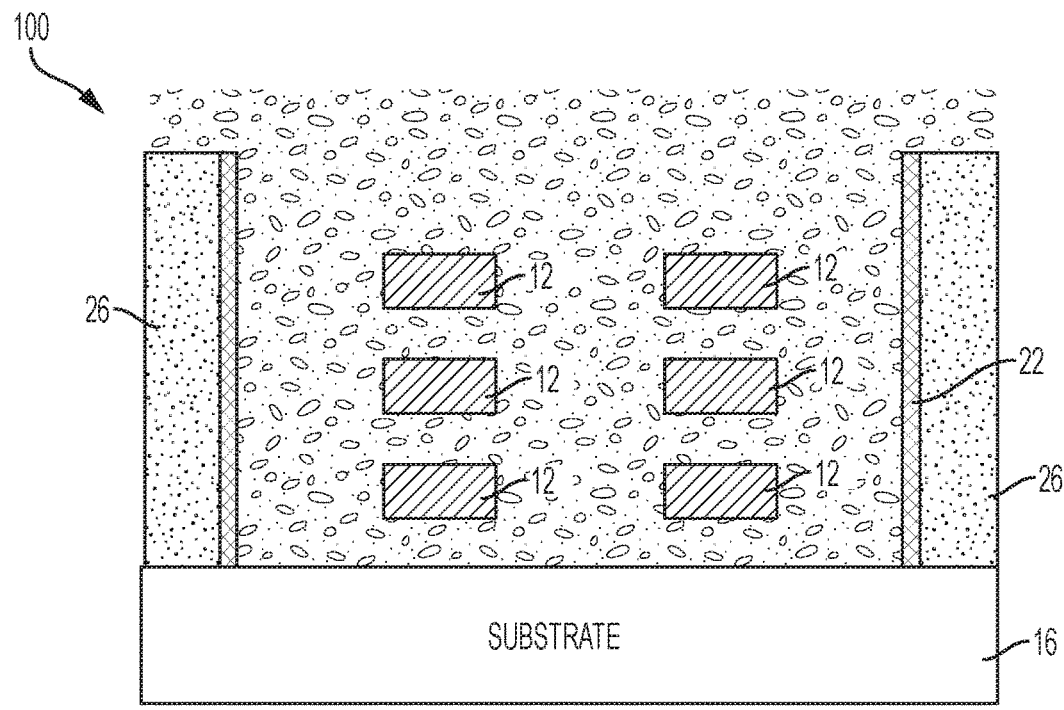
FIG. 28 depicts a schematic cross-sectional view of the nanosheet device region taken along lines 28-28 of FIG. 29 following formation of block mask.
Figure 29:
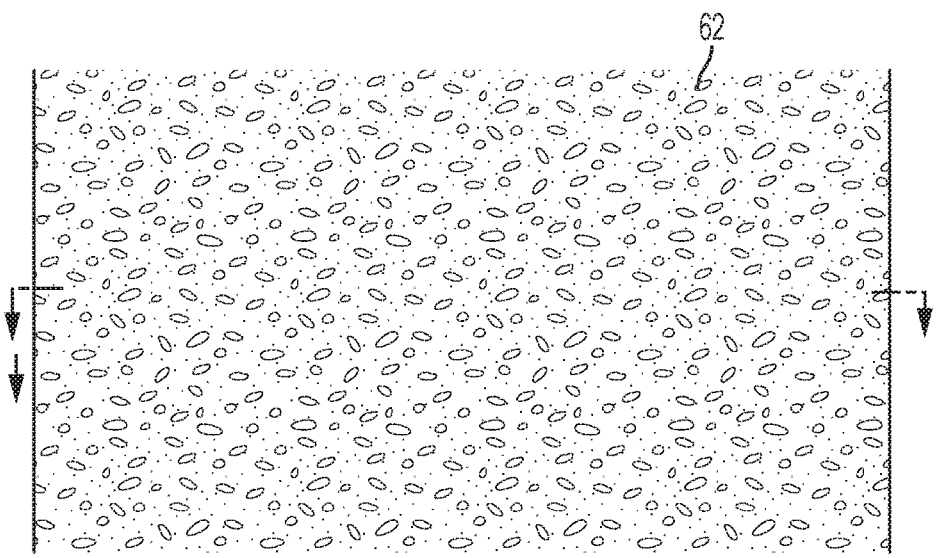
FIG. 29 depicts a top down view of the nanosheet device region of FIG. 28 following formation of block mask.

It should be noted that in the corresponding nanosheet device region shown in FIGS. 24-25, complete removal of the sacrificial layer can be effected because the fin width (sacrificial layer 14) is markedly smaller than the nanosheet width in the capacitor region, i.e., by more than half the width of the nanosheets in the capacitor region. By way of example, isotropic etching to form an undercut in a 50 nm wide sacrificial layer in the capacitor region can be configured to remove about 20 nm or more of the sacrificial layer leaving about 10 nm of the sacrificial layer coupled to the adjacent nanaosheets in the capacitor region, which is effective to remove a 20 nm wide sacrificial layer in the device region in its entirety. The widths are exemplary and are not intended to be limiting. The nanosheets in the device region have a width that is less than half the width of the nanosheets in the capacitor region so as to permit a single isotropic etching process to completely remove the sacrificial layer in the device region (e.g., FIGS. 16-17) while leaving a portion of the sacrificial layer in the capacitor region (e.g., FIGS. 14-15) such that the sacrificial layer is coupled to the adjacent nanosheets, i.e., form a dendritic structure in the capacitor region. Thus, apart from the formation of the capacitor stack using the hard mask, the same processing steps and materials can be utilized in both the capacitor region and the nanosheet device region. As such, a single isotropic etch can be used to for both the capacitor region and the nanodevice region.

The isotropic etching process may be a dry etching or wet etching process. The term "wet etching" generally refers to application of a chemical solution. This is preferably a time controlled dip in the etch solution. The wet etch process may include, for example, buffered hydrofluoric acid (BHF), hydrofluoric acid (HF), hydrofluoric nitric acid (HNA), phosphoric acid, HF diluted by ethylene glycol (HFEG), hydrochloric acid (HCl), or any combination thereof. The term "dry etching" is used here to denote an etching technique such as reactive-ion-etching (RIE), ion beam etching, plasma etching or laser ablation.

Referring now to FIGS. 26-29, the hardmask 18 is selectively removed from the capacitor region 50 and the nanosheet device region 100. A block mask 62 is then formed on the nanosheet device region 100 and the capacitor region is exposed and heavily doped such as by ion implantation or plasma doping. Doping extends into the substrate 16 underlying the capacitor region, the active nanosheet 12 and the remaining sacrificial layer 14. In this manner, the entire dendritic structure 22 defined by patterned nanosheets 12, 14 as presently formed along with the silicon substrate 16 within the capacitor region 10 will become conductors. The presence of the block mask in the nanosheet device region 100 prevents doping of the underlying structures, wherein the substrate underlying the device region is not heavily doped as a function of the doping process.

Referring now to FIGS. 30-33, a high k dielectric material 32 is then conformally deposited onto the dendritic structure and substrate surface of the capacitor region 50. In the nanosheet device region 100 shown in FIGS. 32-33, the high k dielectric material 32 is deposited, about the nanosheets 12, the exposed interior walls of the sidewall spacer 52, and the exposed substrate surface 16 in the nanosheet device region 100.

Exemplary high k dielectrics have k values in excess of 10. In one embodiment, high-k dielectric has a dielectric constant (K) ranging from about 10 to about 30. Non-limiting examples of suitable materials for the dielectric material include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The high k dielectric material 32 may be formed by, for example, chemical vapor deposition (CVD), physical vapor deposition (PVD), plasma enhanced CVD, atomic layer deposition (ALD), evaporation, chemical solution deposition, or like processes.

Figure 30:
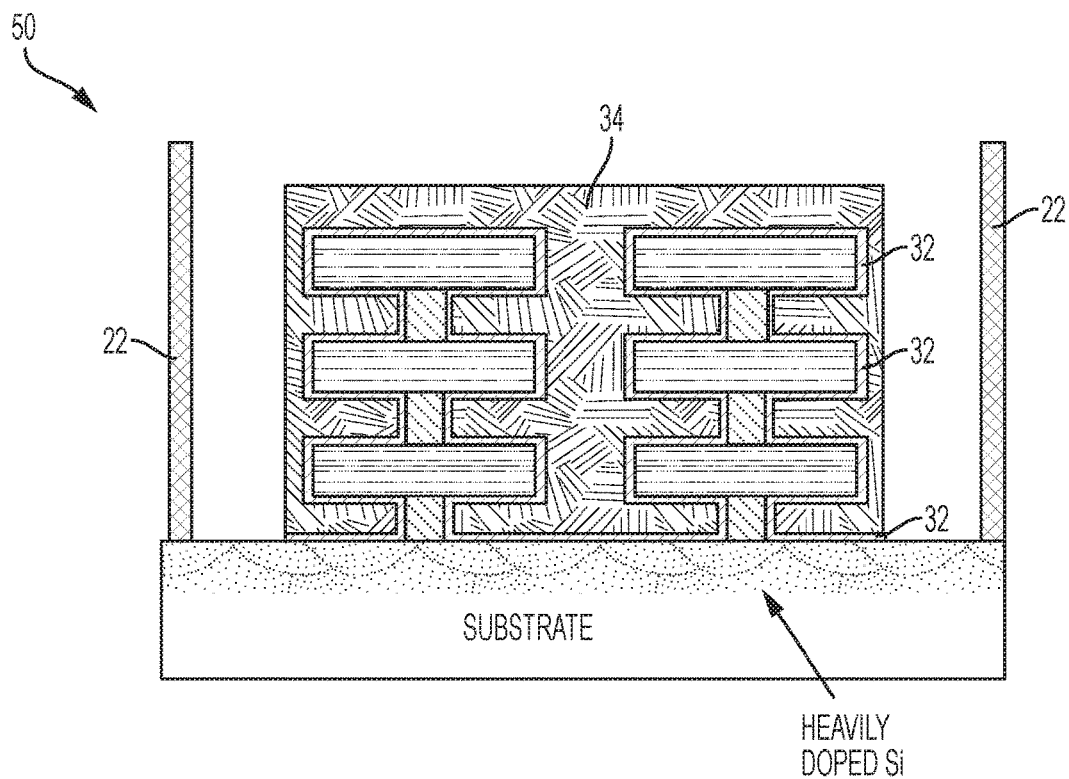
FIG. 30 depicts a schematic cross-sectional view of the nanosheet capacitor region taken along lines 30-30 of FIG. 31 following high k dielectric and metal deposition, and top electrode patterning.
Figure 31:
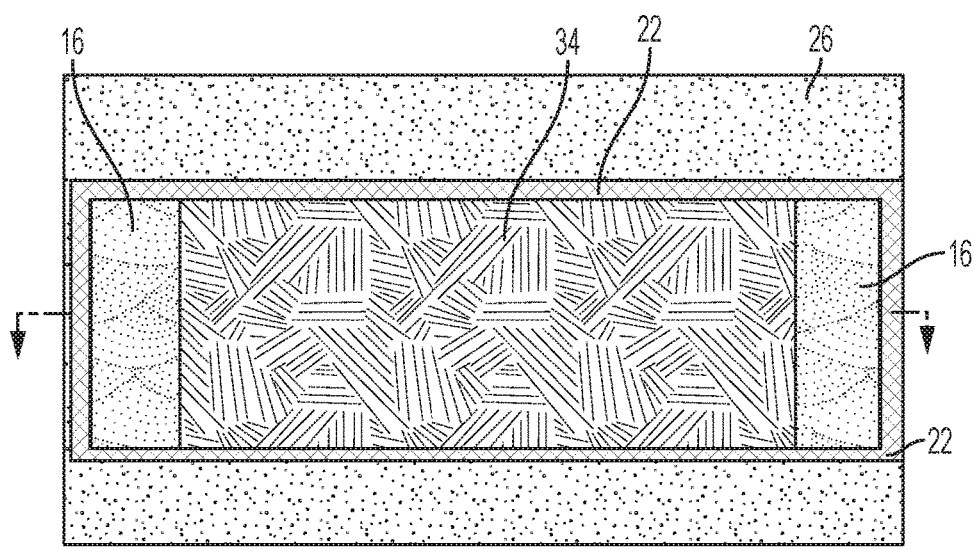
FIG. 31 depicts a top down view of the nanosheet capacitor region of FIG. 30 following high k dielectric and metal deposition, and top electrode patterning.
Figure 32:
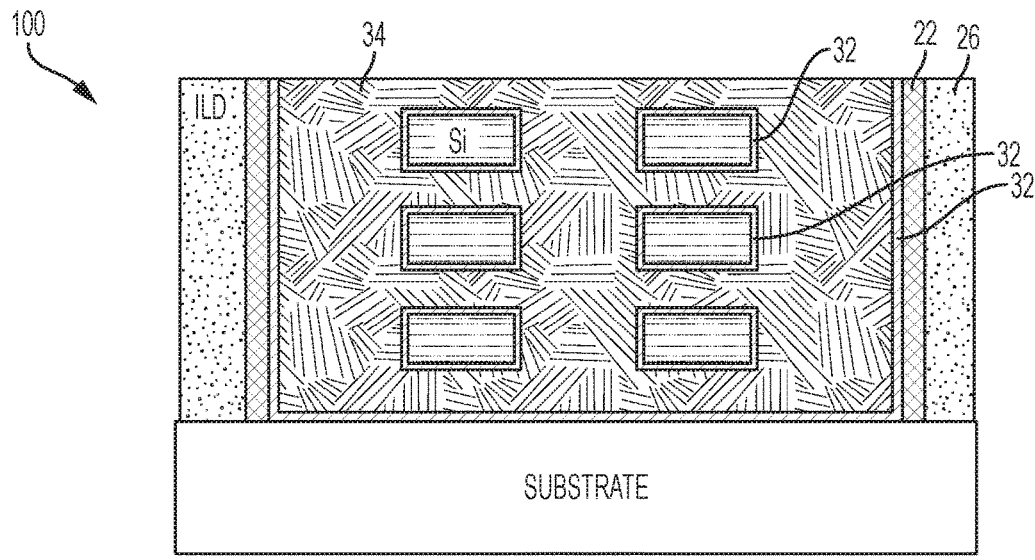
FIG. 32 depicts a schematic cross-sectional view of the nanosheet device region taken along lines 32-32 of FIG. 33 following high k dielectric and metal deposition.
Figure 33:
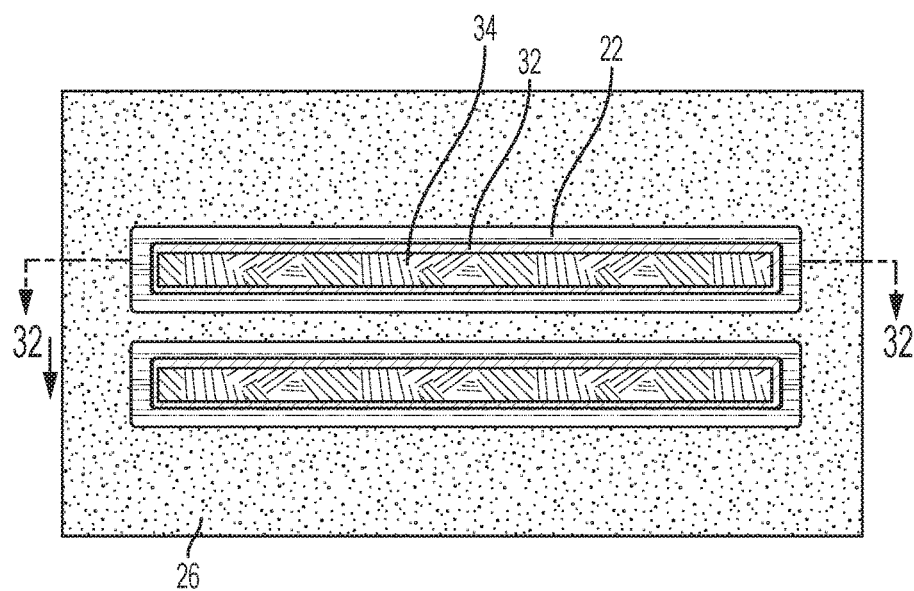
FIG. 33 depicts a top down view of the nanosheet device region of FIG. 32 following high k dielectric and metal deposition.
Figure 34:
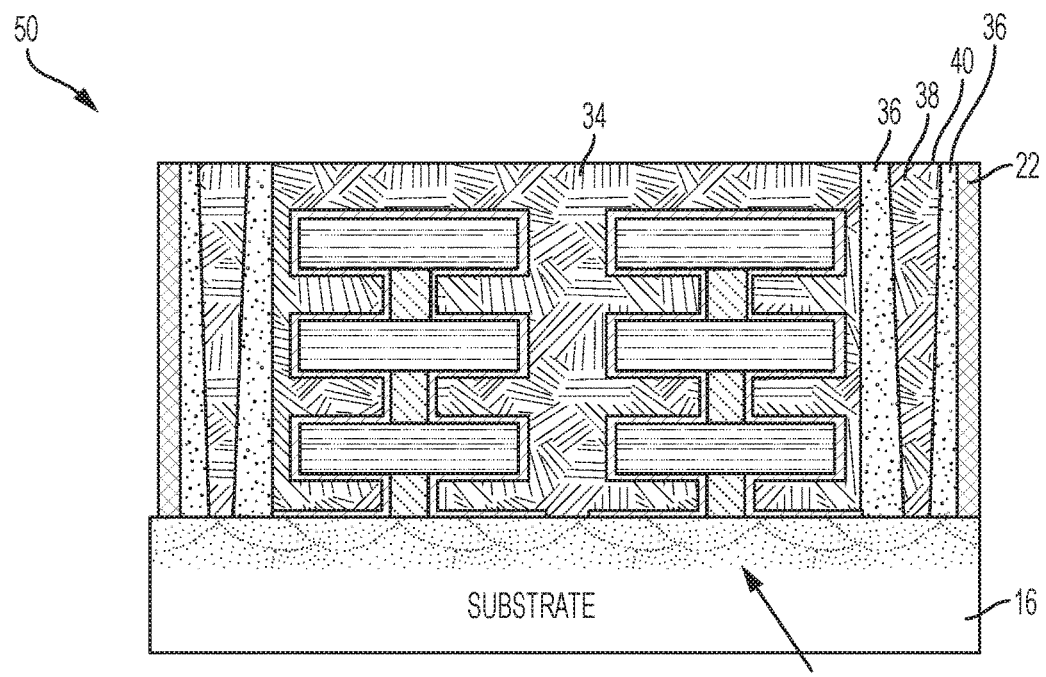
FIG. 34 depicts a schematic cross-sectional view of the nanosheet capacitor region taken along lines 34-34 of FIG. 35 following interlayer dielectric deposition, patterning of bottom electrode, metal contact fill, and planarization.
Figure 35:
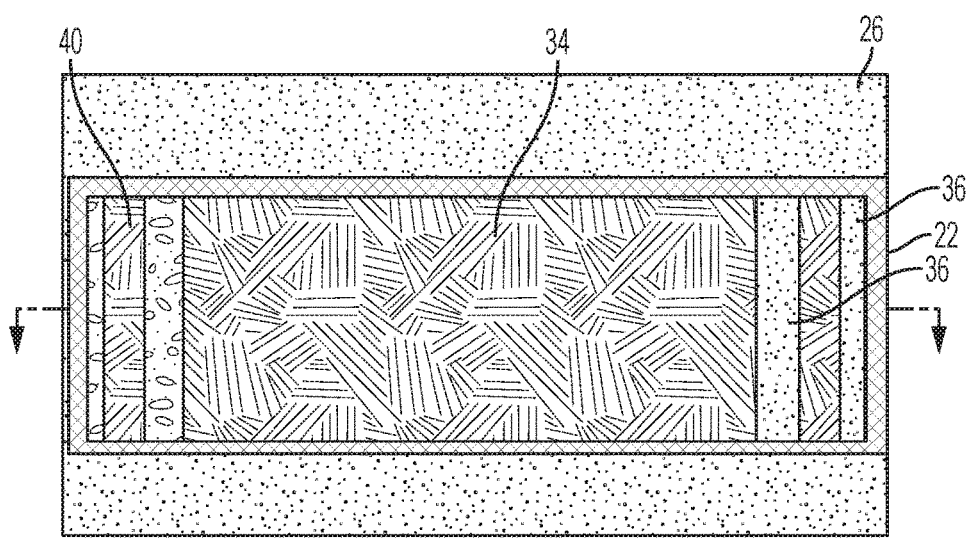
FIG. 35 depicts a top down view of the nanosheet capacitor region of FIG. 34 following interlayer dielectric deposition, patterning of bottom electrode, metal contact fill, and planarization.
Figure 36:
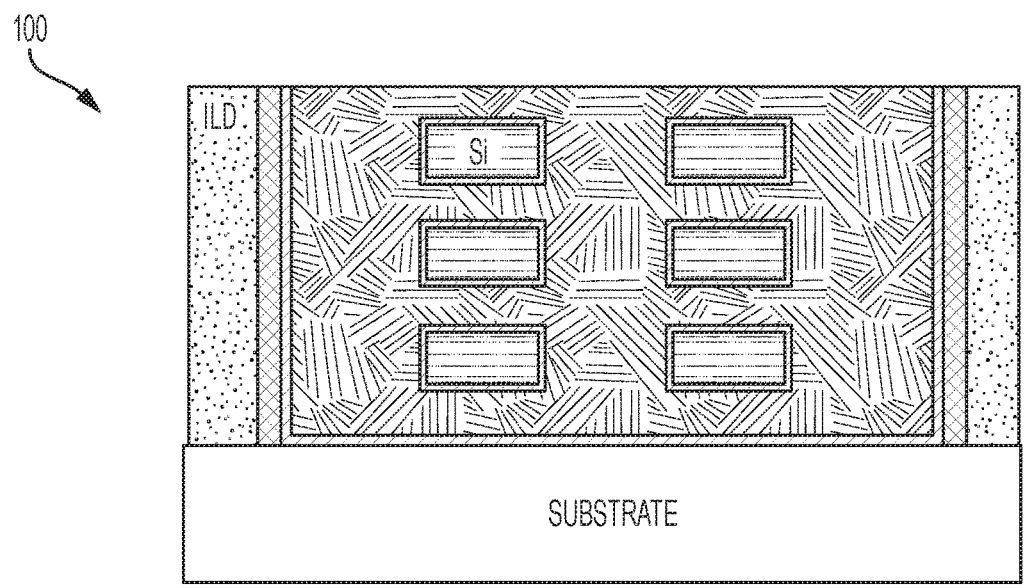
FIG. 36 depicts a schematic cross-sectional view of the nanosheet device region taken along lines 36-36 of FIG. 37 following interlayer dielectric deposition, patterning of bottom electrode, metal contact fill, and planarization.

A top conductive metal material 34 such as tungsten is then deposited onto the patterned stack in the capacitor region 50 and the nanosheet device region 100. The conductive metal may be deposited by a suitable deposition process, for example, CVD, PECVD, PVD, plating, thermal or e-beam evaporation, and sputtering. In the capacitor region 50, the top conductive metal material 34 is patterned by anisotropically etching the metal and high k dielectric to expose the (heavily doped) conductive substrate surface 16 as shown in FIGS. 30-31. The conductive metal material 34 will be configured as the top electrode in the nanosheet capacitor structure.

Referring now to FIGS. 34-37, an ILD 36 is deposited into the recess previously formed in the capacitor region 50. The ILD 36 may include any materials known in the art, such as, for example, porous silicates, carbon doped oxides, silicon dioxides, silicon nitrides, silicon oxynitrides, or other dielectric materials. The ILD 36 may be formed using any method known in the art, such as, for example, chemical vapor deposition, plasma enhanced chemical vapor deposition, atomic layer deposition, or physical vapor deposition. Trenches 38 are formed in the ILD and filled with metal 40 such as tungsten, which is configured as a bottom electrode for the capacitor structure. The trenches may be filled by a conductive metal, and, in some embodiments, a liner layer (not shown) to form conductive contacts. A planarization process, for example, chemical mechanical planarization (CMP), is performed to polish the surface.

Figure 37:
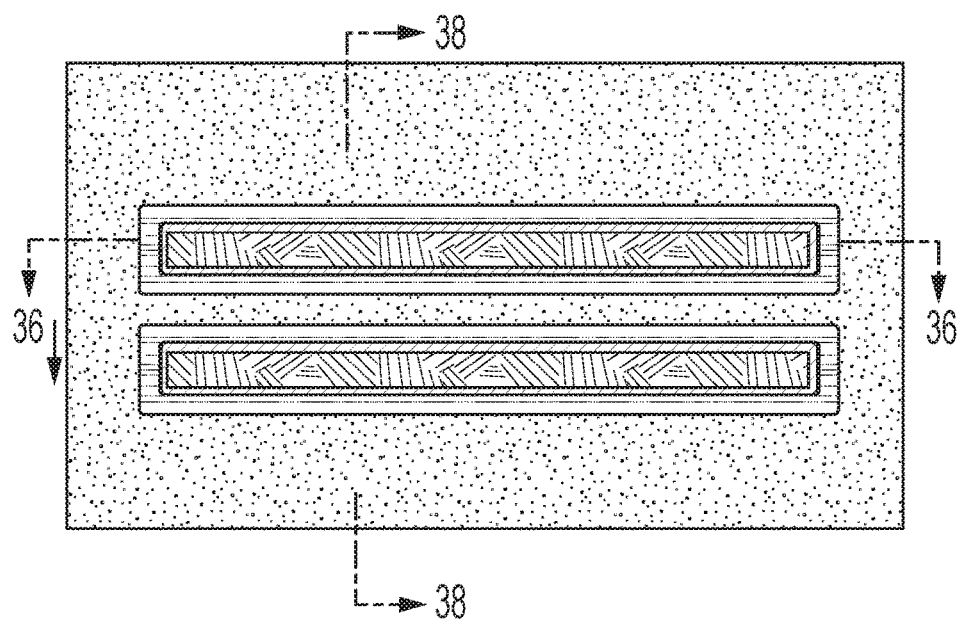
FIG. 37 depicts a top down view of the nanosheet device region of FIG. 36 following interlayer dielectric deposition, patterning of bottom electrode, metal contact fill, and planarization.
Figure 38:
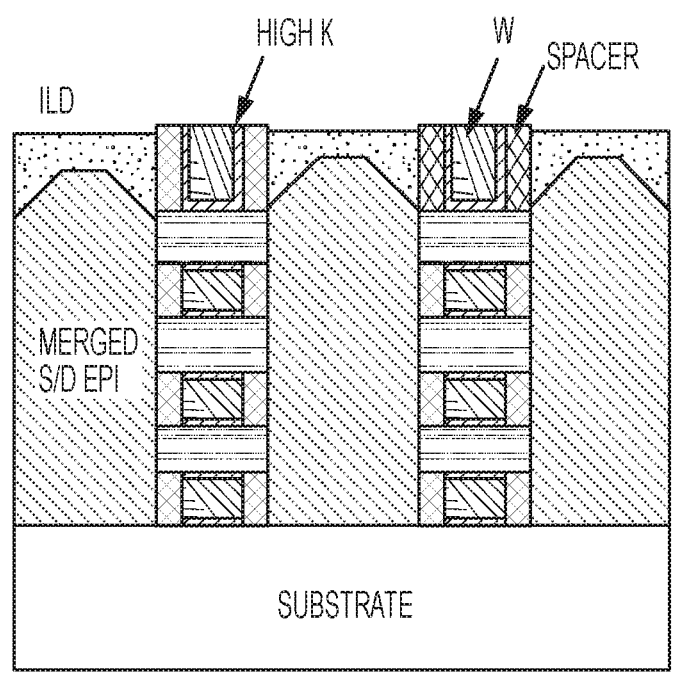
FIG. 38 depicts a schematic cross-sectional view of the nanosheet device region taken along lines 38-38 of FIG. 37 following interlayer dielectric deposition, patterning of bottom electrode, metal contact fill, and planarization.

FIG. 38 provides a cross sectional view of the nano sheet device taken along lines 38-38 of FIG. 37. Source/drain regions are positioned on the substrate and on opposing sides of the gate stack. Source/drain contacts 203 are formed on the source/drain regions 202. An interlayer dielectric (ILD) 220 is disposed around and between the source/drain contacts 203 and the source/drain regions 202.

Again, it should be apparent that the capacitor region 50 shown in the Figures can be formed simultaneously with the nanosheet device region 100, an example of which has been shown above. The FET 100 is formed from the same stacked nanosheet structure as utilized in the capacitor region 50. However, in the nanosheet device region, fin width is 20 nm as opposed to 50 nm in the capacitor region 10. In addition, complete removal of the sacrificial layer 14 can be achieved in the nanosheet device region by a single isotropic etch for both the capacitor region 50 and the nanosheet device region 100.

All ranges disclosed herein are inclusive of the endpoints, and the endpoints are combinable with each other.

All cited patents, patent applications, and other references are incorporated herein by reference in their entirety.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method of making a semiconductor device, the method comprising:
   depositing alternating nanosheet layers and sacrificial layers onto a substrate;
   simultaneously forming fins in a capacitor region and fins in a device region, wherein the fins in the capacitor region have a greater width than the fins in the device region;
   selectively etching the sacrificial layers to form an undercut in the capacitor region and complete removal in the device region;
   doping the alternating nanosheet layers and undercut sacrificial layers in the capacitor region, and portions of the substrate underlying the capacitor region;
   depositing a high k dielectric layer onto the alternating nanosheet layers and undercut sacrificial layers in the capacitor region, and portions of the substrate underlying the capacitor region, and on the nanosheet layers in the device region; and
   forming top and bottom electrodes in the capacitor region.

2. The method of claim 1, wherein depositing the alternating nanosheet layers and sacrificial layers onto the substrate comprises growing silicon layers as the nanosheet layer and silicon-germanium layers as the sacrificial layers.

3. The method of claim 1, wherein forming the fins in the capacitor region and in the device region comprises a sidewall image transfer process.

4. The method of claim 1, wherein selectively etching the sacrificial layers to form the undercut in the capacitor region and complete removal in the device region comprises an isotropic etch process.

5. The method of claim 1, wherein simultaneously forming fins in the capacitor region and fins in the device region comprises providing the alternating nanosheet layers and sacrificial layers with a width of 25 nanometers to 75 nanometers in the capacitor region and a width of the fins in the device region of at least half of the width in the capacitor region.

6. The method of claim 1, wherein doping the alternating nanosheet layers and undercut sacrificial layers in the capacitor region, and portions of the substrate underlying the capacitor region comprises forming a block mask over the device region prior to doping to prevent doping in the device region.

7. The method of claim 1, wherein the nanosheet layers and the sacrificial layers have a thickness from 3 to 30 nanometers.

8. The method of claim 1, wherein the high k dielectric comprises hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate.

9. The method of claim 1, wherein selectively etching the sacrificial layers to form the undercut in the capacitor region and complete removal in the device region comprises a wet etching process.

10. The method of claim 9, wherein the wet etch process comprises exposing the substrate to buffered hydrofluoric acid (BHF), hydrofluoric acid (HF), hydrofluoric nitric acid (HNA), phosphoric acid, HF diluted by ethylene glycol (HFEG), hydrochloric acid (HCl), or any combination thereof.

11. The method of claim 1, wherein the high k dielectric layer has a k value ranging from 10 to 30.

12. A method of making a semiconductor device, the method comprising:
  depositing a film stack onto a silicon substrate, the film stack comprising alternating layers of silicon and silicon-germanium;
  simultaneously defining a capacitor region by forming fins in the film stack having a first width and a device region by forming fins in the film stack having a second width;
  isotropically etching the silicon-germanium to form an undercut in the capacitor region and complete removal in the device region, wherein the second width of the film stack in the device region is at least less than half of the first width of the film stack in the capacitor region such that isotropic etching forms the undercut in the capacitor region and complete removal in the device region;
  doping the nanosheet, sacrificial layers, and portions of the substrate underlying the capacitor region;
  depositing a high k dielectric layer onto the nanosheet, sacrificial layers, and portions of the substrate underlying the capacitor region, and on the nanosheet layers in the device region; and
  forming top and bottom electrodes in the capacitor region.

13. The method of claim 12, wherein doping the nanosheet, sacrificial layers, and portions of the substrate underlying the capacitor region comprises forming a block mask over the device region prior to doping.

14. The method of claim 12, wherein the nanosheet layers and the sacrificial layers have a thickness from 3 to 30 nanometers.

15. The method of claim 12, wherein the high k dielectric comprises hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate.

16. The method of claim 12, wherein each one of the nanosheets has a thickness equal to each one of the sacrificial layers.

17. The method of claim 12, wherein the nanosheets in the capacitor region have a width of 25 to 75 nanometers.

18. The method of claim 12, wherein the high k dielectric layer has a k value ranging from 10 to 30.

19. The method of claim 12, wherein isotropically etching the silicon-germanium to form an undercut in the capacitor region and complete removal in the device region comprises exposing the substrate to buffered hydrofluoric acid (BHF), hydrofluoric acid (HF), hydrofluoric nitric acid (HNA), phosphoric acid, HF diluted by ethylene glycol (HFEG), hydrochloric acid (HCl), or any combination thereof.

20. The method of claim 12, wherein isotropically etching the silicon-germanium to form an undercut in the capacitor region and complete removal in the device region comprises reactive ion etching.

* * * * *